United States Patent
Chou et al.

(10) Patent No.: US 7,489,182 B2
(45) Date of Patent: Feb. 10, 2009

(54) CHARGE PUMP START UP CIRCUIT AND METHOD THEREOF

(75) Inventors: Hung-Che Chou, Jiadong Township, Pingtung County (TW); Chao-Hsuan Chuang, Chupei (TW); Cheng-Hsuan Fan, Hukou Township (TW); Liang-Pin Tai, Gueiren Township, Tainan County (TW)

(73) Assignee: Richtek Technology Corporation, Hsin-Chu (TW)

( * ) Notice: Subject to any disclaimer, the term of this patent is extended or adjusted under 35 U.S.C. 154(b) by 0 days.

(21) Appl. No.: 11/749,872

(22) Filed: May 17, 2007

(65) Prior Publication Data

US 2008/0284503 A1 Nov. 20, 2008

(51) Int. Cl.
*G05F 1/10* (2006.01)
(52) U.S. Cl. ....................................... 327/536
(58) Field of Classification Search .................. 327/143, 327/536
See application file for complete search history.

(56) References Cited

U.S. PATENT DOCUMENTS

| | | | | |
|---|---|---|---|---|
| 4,739,191 A * | 4/1988 | Puar | ............................. | 327/536 |
| 5,585,991 A * | 12/1996 | Williams | ....................... | 361/30 |
| 6,331,794 B1 * | 12/2001 | Blanchard | ..................... | 327/112 |
| 7,034,587 B2 * | 4/2006 | Marotta | ....................... | 327/143 |
| 7,342,433 B2 * | 3/2008 | Harris et al. | ................. | 327/427 |

* cited by examiner

*Primary Examiner*—Jeffrey S Zweizig
(74) *Attorney, Agent, or Firm*—Tung & Associates

(57) ABSTRACT

The present invention discloses a charge pump start up circuit comprising: a start up transistor having one end which is electrically connected with a voltage supply source, and another end which is electrically connected to a voltage node; and a charge pump circuit having an input which is electrically connected with the voltage node, and an output which is electrically with the gate of the start up transistor.

2 Claims, 5 Drawing Sheets

CHARGE PUMP START UP CIRCUIT AND METHOD THEREOF

FIELD OF INVENTION

The present invention relates to a start up circuit, in particular to a start up circuit having a start up transistor under control by a charge pump, and a method thereof.

BACKGROUND OF THE INVENTION

A start up circuit is often required when a power supply circuit supplies voltage to a power circuit within an integrated circuit (IC). The start up circuit provides a starting bias voltage until the power circuit is able to function regularly. Afterwards, the start up circuit is expected to be idle and consume no power, if ideally. FIG. 1 is a diagram illustrating relationships among a start up circuit 10, a power supply 100 and a power circuit 200. During initialization stage, the power circuit 200 has not been provided with power yet. Therefore, it is necessary to provide a start up circuit 10 to charge the capacitor C until the voltage at the node Vbias reaches a predetermined value that is able to turn ON the power circuit 200. After the power circuit 200 is turned ON, it may operate without aid from the start up circuit 10. For example, the power circuit 200 may obtain power from the power supply 100 via some other approach and transfer the power into a low DC voltage Vdd required by the IC. The details are not described here for that they are well known to those skilled in the art.

FIG. 2 is a diagram illustrating a prior art start up circuit 10. Since the start up circuit 10 is expected to consume as little current as possible, the simplest approach to implement the star-up circuit is to provide a resistor 20 of high resistance. The resistor 20 transfers the voltage from the power supply 100 to a low current, charging the capacitor C until the node Vbias reaches a predetermined voltage value. The voltage at the node Vbias, for example, maybe provided to drive a pulse width modulation (PWM) circuit 12 in the power circuit 200, and the power circuit operates under the control of the PWM circuit 12. The details of the PWM circuit and how it controls the power circuit 200 are not described here for that they are well known to those skilled in the art.

According to the prior art illustrated in FIG. 2, the resistance of the resistor 20 must be quite large to limit the current, because the voltage provided by the power supply 100 is quite high. Accordingly, the area of the resistor 20 inevitably becomes very large, and a huge amount of heat is generated. Moreover, such start up circuit cannot be turned OFF; the serious problems of power consumption and heat generation go on even after the power circuit has been started up.

Another start up circuit is disclosed in U.S. Pat. No. 5,285,369 "Switched Mode Power Supply Integrated Circuit with Start up Self Biasing". The disclosed circuit is very complicated, and a simplified form thereof is illustrated in FIG. 3. This prior art utilizes the characteristics of the parasitic junction transistor inherently existing with a metal-oxide-semiconductor field-effect transistor (MOSFET). As shown in the figure, the MOSFET 84 may be taken as a combination of a junction field-effect transistor (JFET) 86 and a MOSFET 88. The JFET 86 is a depletion mode transistor, inherently capable of limiting current, and it is normally in an ON state as its gate is electrically connected to ground. The node between the JFET 86 and the MOSFET 88 provides current for starting up a control circuit 14. The control circuit 14 provides two functions: on the one hand, the control circuit 14 charges the capacitor C; on the other hand, when a voltage at the node Vbias reaches a predetermined value, the control circuit 14 generates a control signal to switch off the MOSFET 88 and turn off the start up circuit formed by the MOSFET 84 and the control circuit 14.

Though the conventional start up circuit illustrated in FIG. 3 can be automatically turned off and the heat generated by the circuit is much less than that in FIG. 2, the structure of the control circuit 14 is still too complicated(as may be understood by referring to the details thereof), which is undesired.

Therefore, another circuit structure is disclosed in U.S. Pat. No. 5,477,175 "Off-Line Bootstrap Start up Circuit", which is simpler than the circuit in FIG. 3. As illustrated in FIG. 4, the circuit disclosed in U.S. Pat. No. 5,477,175 obtains current from the node between the depletion mode FET 101 and the MOSFET 102, and transfers the current to voltage by a resistor 103, which is supplied to the gate of the MOSFET 102 to turn ON the MOSFET 102. After the power circuit 200 is started, the transistor switch 109 can be switched ON by controlling the node 113, to pull down the gate voltage of the MOSFET 102. The MOSFET 102 is thus turned OFF.

Though the complexity of the circuit illustrated in FIG. 4 is reduced as compared to the circuit disclosed in U.S. Pat. No. 5,285,369, it is still not satisfactory. First, in order to turn OFF the MOSFET 102, the transistor 109 is kept conductive after the power circuit 200 is started, and thus there is a power consumption path from depletion mode FET 101—resistor 103—transistor switch 109 to ground. Second, the depletion mode FET 101 has a "body effect". When it supplies current to the resistor 103 to increase the gate voltage of the MOSFET 102, its own source voltage also increases, which deteriorates its body effect and reduces the current flowing through the depletion mode FET 101. In a worst case the depletion mode FET 101 may shut down.

In view of the foregoing, it is desired to provide an improved start up circuit which is free from the drawbacks of power consumption and body effect in the prior art.

SUMMARY OF THE INVENTION

It is therefore an aspect of the present invention to provide a start up circuit having a start up transistor under control by a charge pump.

It is a second aspect of the present invention to provide a method for starting up a circuit.

In accordance with the foregoing and other objectives of the present invention, and as disclosed by one embodiment of the present invention, a charge pump start up circuit comprising: a start up transistor having one end which is electrically connected with a voltage supply source, and another end which is electrically connected to a voltage node; and a charge pump circuit having an input which is electrically connected with the voltage node, and an output which is electrically with the gate of the start up transistor.

In the embodiment above, preferably, when the voltage at the voltage node reaches a predetermined value, the gate of the depletion mode transistor is electrically connected to ground, and the charge pump circuit stops operation.

Further, the present invention also discloses a start up method for supplying voltage from a voltage supply source to a power circuit, the method comprising: providing a depletion mode transistor electrically connected between the voltage supply source and a voltage node; turning on the depletion mode transistor; and increasing the gate voltage of the depletion mode transistor correspondingly as the source voltage of the depletion mode transistor increases, so that the gate to source voltage of the depletion mode transistor does not decrease.

In the embodiment above, preferably, when the voltage at the voltage node reaches a predetermined value, the gate of the depletion mode transistor is electrically connected to ground, so that the increase of the gate voltage of the depletion mode transistor no more follows the increase of the source voltage of the depletion mode transistor.

It is to be understood that both the foregoing general description and the following detailed description are provided as examples, for illustration rather than limiting the scope of the invention.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENT

The drawings as referred to throughout the description of the present invention are for illustration only, but not drawn according to actual scale.

Figure 1:
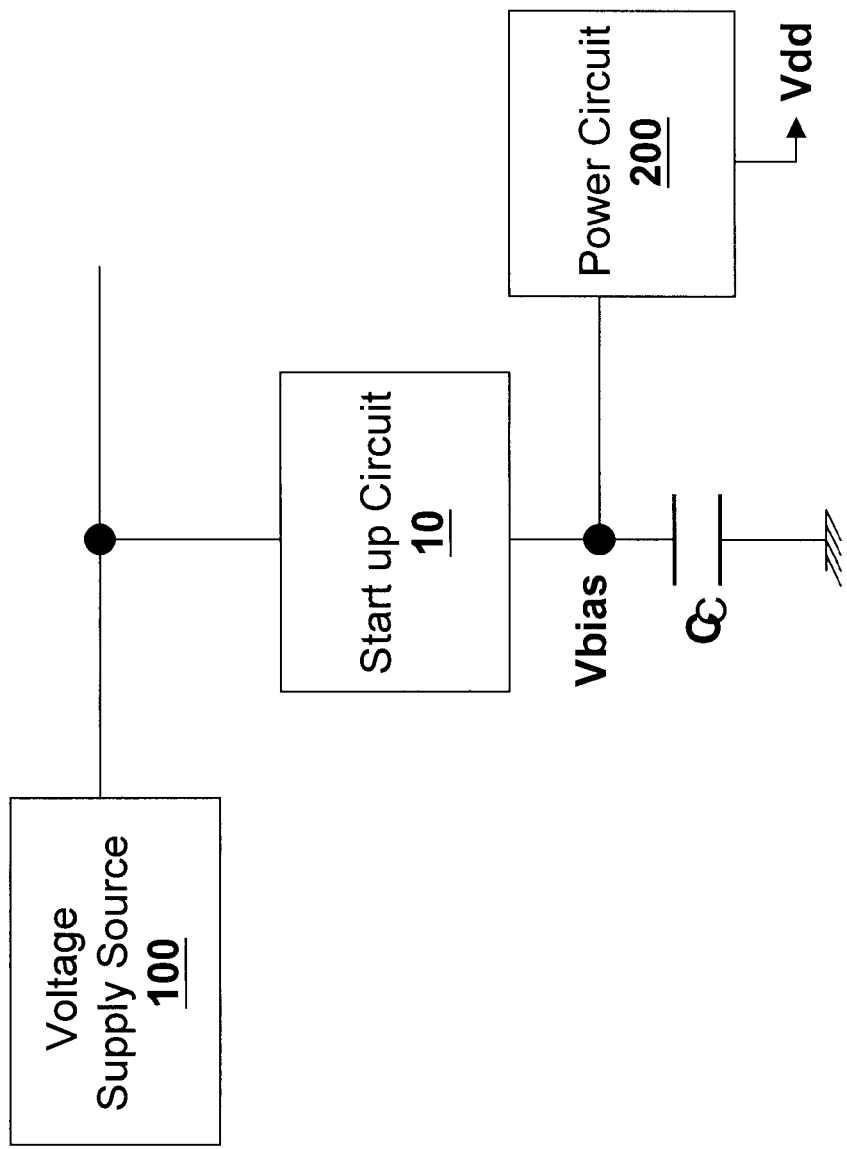
FIG. 1 is a diagram showing a typical structure of a start up circuit.
Figure 2:
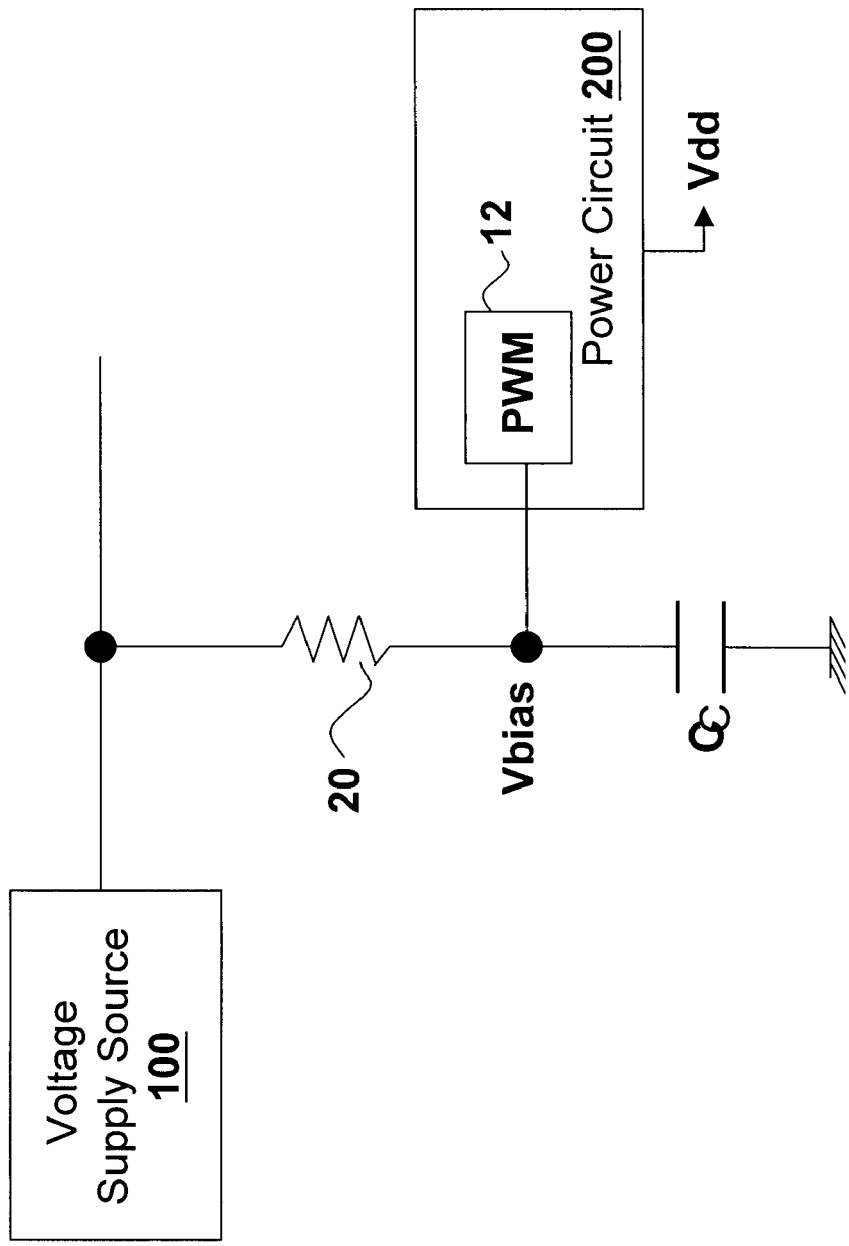
FIG. 2 is a circuit diagram of a conventional start up circuit having a resistor.
Figure 3:
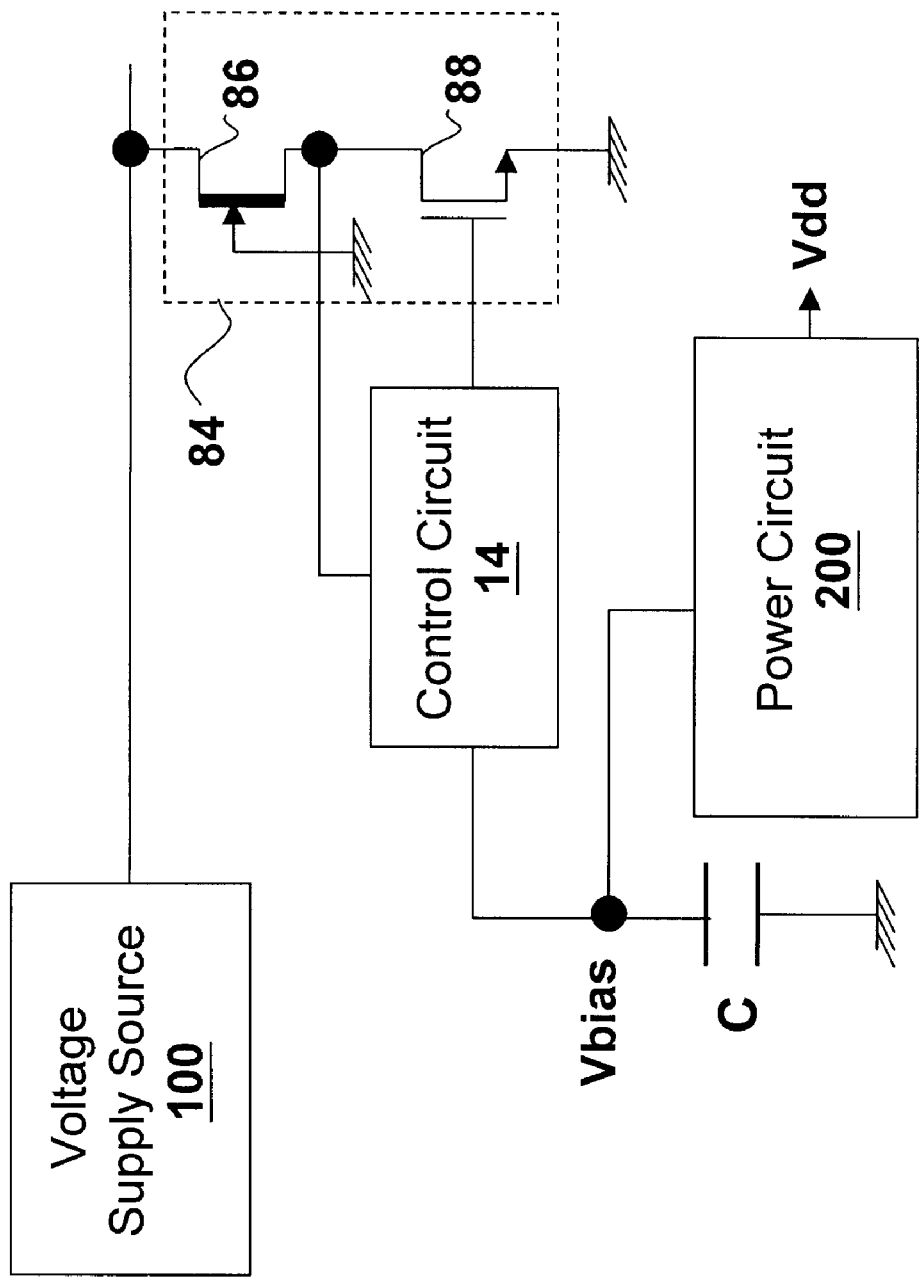
FIG. 3 is a circuit diagram showing another prior art start up circuit.
Figure 4:
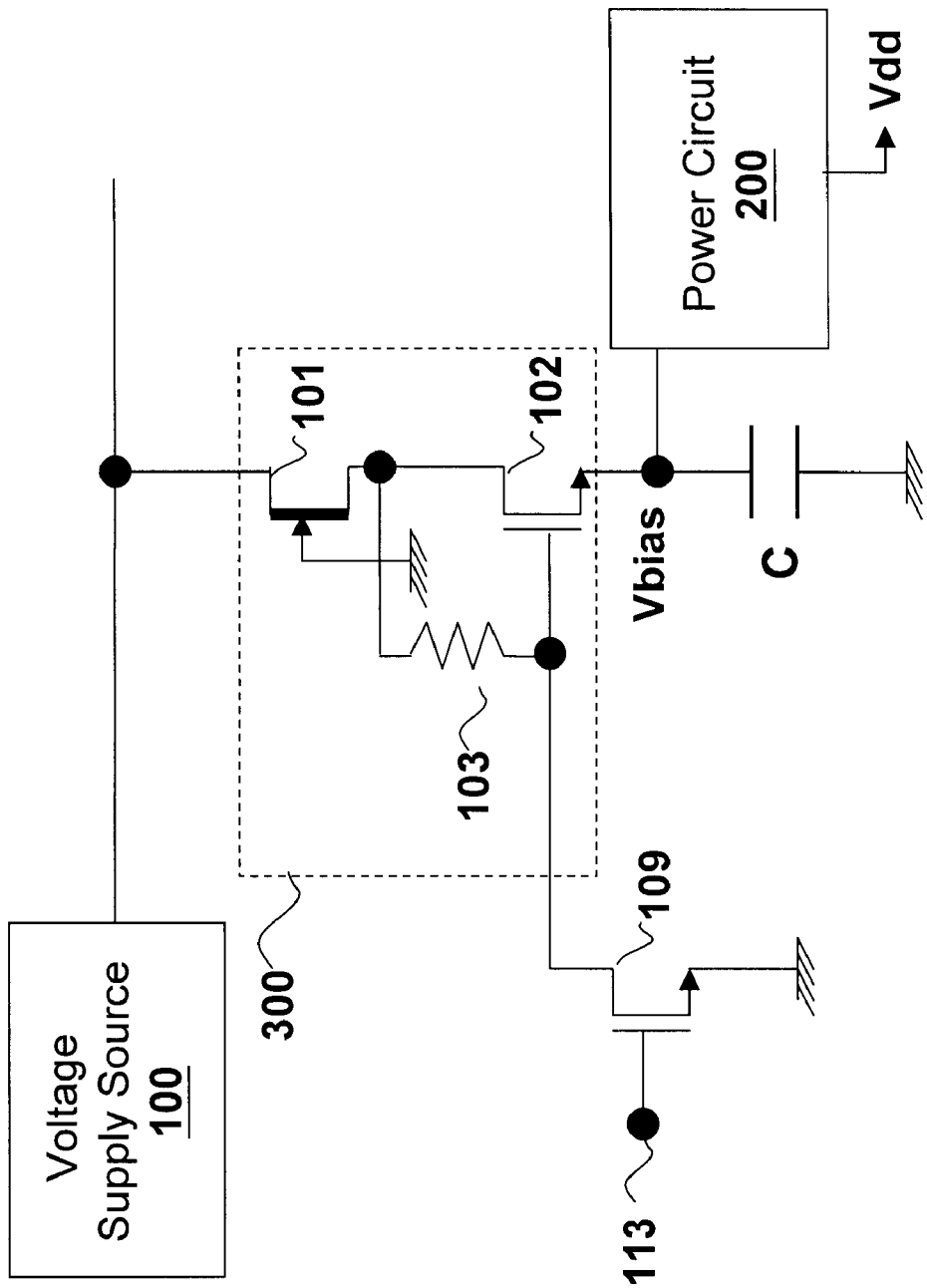
FIG. 4 is a circuit diagram showing yet another prior art start up circuit.
Figure 5:
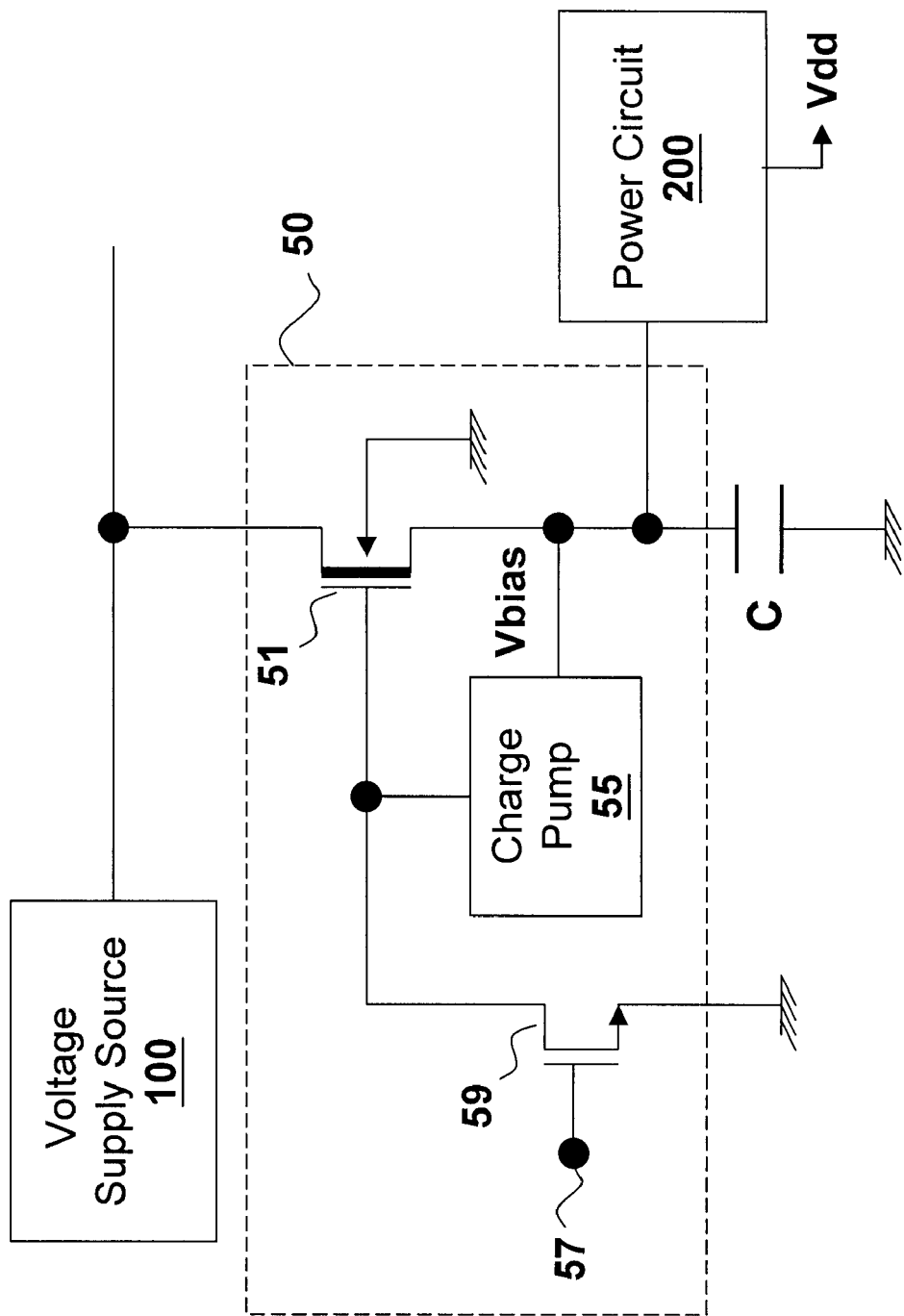
FIG. 5 is a circuit diagram showing an embodiment of the present invention.

FIG. 5 is a schematic circuit diagram illustrating an embodiment of the present invention. According to the present embodiment, a start up circuit 50 provided between the power supply 100 and the power circuit 200 includes a start up transistor 51 which is a depletion mode transistor; a charge pump circuit 55; and a transistor switch 59. As an example, the depletion mode transistor 51 is shown as a MOSFET, but it may be other forms of depletion mode transistor, such as a JFET.

As shown in the figure, the gate of the depletion mode transistor 51 is controlled by the output of the charge pump circuit 55. In circuit initialization stage, the voltage at the node Vbias is zero, and the output of the charge pump circuit 55 is also zero; the depletion mode transistor 51 is conductive. Later, when the voltage at the node Vbias increases, the body effect of the depletion mode transistor 51 deteriorates. However, the charge pump circuit 55 provides an output which is higher than and is a function of its input. Thus, when the voltage at the node Vbias increases, the gate voltage of the depletion mode transistor 51 correspondingly increases, so that the gate to source voltage Vgs of the depletion mode transistor 51 increases, eliminating any possible drawback caused by the body effect.

After the voltage across the capacitor C reaches a predetermined value to start up the power circuit 200, the control node 57 may be supplied with current provided by the power circuit 200 to turn ON the transistor switch 59. The gate voltage of the depletion mode transistor 51 is thus pulled down, and hence the depletion mode transistor 51 is turned OFF. The operation of the charge pump circuit 55 correspondingly stops, so there is no power consumption in the start up circuit 50. It can readily be seen that this circuit is more power-saving than the previously discussed prior art.

The charge pump circuit 55 may be embodied in any form, as one skilled in this art may readily conceive in light of the teaching from the present invention.

In summary, the present invention provides at least the following advantages over the prior art: (1) The circuit includes no resistor, so there are no heat dissipation and power consumption issues. (2) It does not require any complicated high voltage device. (3) It solves the body effect issue involved in using the depletion mode transistor.

Although the present invention has been described in considerable detail with reference to certain preferred embodiment thereof, it is for illustrative purpose rather than for limiting the scope of the present invention. Other variations and modifications are possible. For example, one may insert circuit devices which do not affect the primary function of the circuit, such as a switch, between two of the illustrated devices. In view of the foregoing, it is intended that the present invention cover all such modifications and variations, which should be interpreted to fall within the scope of the following claims and their equivalents.

What is claimed is:

1. A start up method for supplying voltage from a voltage supply source to a power circuit, comprising:
    providing a depletion mode transistor electrically connected between the voltage supply source and a voltage node;
    turning on the depletion mode transistor;
    increasing the gate voltage of the depletion mode transistor correspondingly as the source voltage of the depletion mode transistor increases, so that the gate to source voltage of the depletion mode transistor does not decrease, and
    when the voltage at the voltage node reaches a predetermined value, pulling down the gate voltage of the depletion mode transistor.

2. The start up method of claim 1, wherein the step of pulling down the gate voltage of the depletion mode transistor includes: electrically connecting the gate of the depletion mode transistor to ground.

* * * * *